United States Patent
Tacconi

(10) Patent No.: US 6,686,731 B2
(45) Date of Patent: Feb. 3, 2004

(54) WATTHOUR METER AND OPTICAL PICKUP TEST DEVICE AND METHOD

(75) Inventor: Eugenio J. Tacconi, Arlington, TX (US)

(73) Assignee: AVO Multi-Amp Corporation, Dallas, TX (US)

(*) Notice: Subject to any disclaimer, the term of this patent is extended or adjusted under 35 U.S.C. 154(b) by 0 days.

(21) Appl. No.: 10/223,337

(22) Filed: Aug. 19, 2002

(65) Prior Publication Data

US 2003/0038621 A1 Feb. 27, 2003

Related U.S. Application Data

(60) Provisional application No. 60/314,402, filed on Aug. 22, 2001.

(51) Int. Cl.[7] .......................... G01R 7/00; G01R 11/32
(52) U.S. Cl. ..................... 324/142; 324/74; 340/870.02
(58) Field of Search ....................... 324/74, 118, 103 R, 324/141–142, 158.1; 340/870.02, 870.03, 870.06, 870.07, 870.11, 870.18, 870.29, 545.3

(56) References Cited

U.S. PATENT DOCUMENTS

| | | |
|---|---|---|
| 1,237,379 A | 8/1917 | Platt |
| 2,586,008 A | 2/1952 | Davis, III .................... 175/183 |
| 2,599,378 A | 6/1952 | Fleischmann ................ 175/183 |
| 3,943,413 A | 3/1976 | Keever ......................... 317/107 |
| 4,271,390 A | 6/1981 | Canu ............................ 324/74 |
| 4,327,362 A * | 4/1982 | Hoss ....................... 340/870.02 |
| 4,646,003 A | 2/1987 | Phillips et al. ............... 324/74 |
| 5,005,005 A | 4/1991 | Brossia et al. ............. 340/604 |
| 5,590,179 A | 12/1996 | Shincovich et al. ......... 379/107 |
| 5,650,717 A | 7/1997 | Draus et al. .................. 324/74 |
| 5,874,732 A | 2/1999 | Giles ....................... 250/231.17 |
| 6,124,806 A * | 9/2000 | Cunningham et al. . 340/870.02 |

FOREIGN PATENT DOCUMENTS

| | | | |
|---|---|---|---|
| DE | 200 04 906 U | 10/2000 | ........... G01R/35/04 |
| FR | 2 741 158 A | 5/1997 | ........... G01R/35/00 |
| WO | WO 94 07155 A | 3/1994 | ........... G01R/35/04 |

OTHER PUBLICATIONS

"Electrical Test Equipment and Measuring Instruments" (catalog), 24 pages, Avo International.
Advertisement for "Model 1000—Computer Controlled Automated Watthour Meter Test System" at the Internet website for Watthour Engineering, www.watthour.com/web_doc/mod1000.htm, dated Jun. 21, 2001, 4 pages.

(List continued on next page.)

*Primary Examiner*—Kamand Cuneo
*Assistant Examiner*—Minh N. Tang
(74) *Attorney, Agent, or Firm*—Conley Rose, P.C.; J. Robert Brown, Jr.

(57) ABSTRACT

A watthour meter testing device for testing watthour meters is provided that includes a measuring device, a switch, a transmitter and a receiver. The measuring device is in communication with the power measured by the watthour meter. The switch is operable to test electromechanical watthour meters in a first position and operable to test electronic watthour meters in a second position. The transmitter is operative to transmit a light signal to a consumption indicator on the watthour meter when the switch is in the first position for testing electromechanical watthour meter. The receiver is operative to detect the light signal transmitted from the transmitter and reflected from the consumption indicator on the watthour meter when the switch is in a first position. The receiver is further operative to detect a consumption light signal emanating from the electronic watthour meters when the switch is in a second position.

39 Claims, 8 Drawing Sheets

OTHER PUBLICATIONS

Advertisement for "Model 1300—Computer Controlled Automated Watthour Meter Test System" at the Internet website for Watthour Engineering, www.watthour.com/web_doc/mod1300.htm, dated Jun. 21, 2001, 4 pages.

Advertisement for "Model 2350—Automated Three Phase Computer Controlled Watthour Meter Test System" at the Internet website for Watthour Engineering, www.watthour.com/web_doc/mod2350.htm, dated Jun. 21, 2001, 5 pages.

Advertisement for "Model 3200—Shop Stand Adapter" at the Internet website for Watthour Engineering, www.watthour.com/web_doc/mod3200.htm, dated Jun. 21, 2001, 2 pages.

* cited by examiner

WATTHOUR METER AND OPTICAL PICKUP TEST DEVICE AND METHOD

CROSS-REFERENCE TO RELATED APPLICATIONS

This application claims priority from, and hereby incorporates by reference for all purposes, copending U.S. Provisional Patent Application Serial No. 60/314,402 entitled Watthour Meter and Optical Pickup Test Device and method, naming Eugenio J. Tacconi as inventor, filed Aug. 22, 2001.

TECHNICAL FIELD OF THE INVENTION

The present invention relates to the field of watthour meter testing devices and more specifically, but not by way of limitation, to a watthour meter test device and method having an optical pickup for testing electromechanical and electronic watthour meters.

BACKGROUND OF THE INVENTION

Metering devices are located at residential and commercial customer locations as a means for electricity providers to measure electrical consumption. Watthour meters are commonly employed to measure electrical consumption at these locations. Watthour meters are typically electronic or electromechanical.

The electromechanical watthour meter is essentially an electric motor that runs in proportion to the power being used by the customer. Electromechanical meters employ a disc that is centrally disposed in the meter such that at least a portion of the disc is visible from the face of the meter. The disc is rotated by the meter's electric motor relative to power consumption. For measurement purposes, these discs include holes extending through the discs or marks or indicia on an upper or outer peripheral edge of the disc. The electrical consumption is relative to the disc's rotation between the hole or marks over a give time-interval.

Electronic watthour meters are generally solid-state and measure electrical consumption electronically. Electronic meters are provided with an indicator light visible on the face of the meter that flashes periodically relative to electrical consumption.

Watthour meter manufacturers, as well as electric utilities, employ testing equipment to verify the accuracy of the watthour meters. For testing, a known amount of power is applied to the watthour meter and compared to that measured by the rotation of the disc.

The testing devices necessarily include a means for detecting the rotations of the disc on electromechanical watthour meters or the flashing light on electronic meters. One such detector is the C-sensor, which includes a light transmitter and receiver used to detect the hole in the discs of electromechanical watthour meters. Thus, as the disc rotates, transmitted light projects through the hole in the disc and is detected by the receiver of the C-type sensor. The power consumption measured by the disc rotation of the watthour meter and detected by the C-sensor is compared to the known power applied to the watthour meter by the watthour meter testing device. In this manner, the accuracy of the watthour meter can be determined.

C-sensors are unable to detect black marks on the upper or outer edge of the discs of electromechanical watthour meters. Instead, various methods for detecting these marks have been attempted. However, non-standardized meters are marked differently. Testing electronic watthour meters is equally challenging, since these meters are also not standardized. Also, different detection systems are necessary for different watthour meters. Present test device systems are unable to accurately discern the markings on electromechanical watthour meters, while consistently measuring electronic meters.

For this reason, a new and improved watthour meter test device and optical pickup is needed.

SUMMARY OF THE INVENTION

As mentioned above, C-sensors are unable to detect black marks on the upper or outer edge of the discs of electromechanical watthour meters. The inventor of the present was the first to identify the problems raised by modern electric and electromechanical watthour meters that that exposes the shortcomings of present test devices. When employing transmitters to transmit a light onto the disc surface or edge such that the light is reflected from the disc, a receiver is positioned to detect the reflected light and determine the location of the black mark on the disc based upon the attributes of the reflected light signal.

However, difficulties arise when the disc is provided with numerous black marks, only one of which, such as the thickest or longest, is intended for power consumption measurement. The lack of standardization in the watthour meter industry adds to the problem, since it is the prerogative of every manufacturer to mark the discs differently. Discerning ambient light from the reflected light further magnifies the difficulty in detecting the marks on the discs. For this reason, current detection devices are incapable of accurately detecting or discerning the relevant black mark from the other marks on the disc surface or edge because of the varied sizes, placements and other factors.

Measuring electronic watthour meters requires detecting the light flashes on the face of the meter. The difficulty with testing electronic watthour meters is detecting indicator lights having non-standardized attributes, such as those having a wide color range. Discerning ambient light is similarly problematic when detecting the indicator lights on electronic watthour meters.

Considerably different detection systems are necessary to detect the holes through the discs, black marks on the discs of electromechanical watthour meters, as are system for detecting the light flashes from electronic watthour meters. Current systems are unable to accurately discern the relevant black mark on the discs of electromechanical watthour meters while consistently detecting the wide color range of lights provided on numerous electronic meters. The present invention provides a novel solution to these problems.

In one aspect, the present invention is directed to a watthour meter test device for testing electromechanical and electronic watthour meters. The watthour meter testing device has a housing provided with a socket adapted to receive a watthour meter. The watthour meter testing device is provided with current and voltage generators. The current generator communicates with the socket and is adapted to communicate a current to the watthour meter. The voltage generator communicates with the socket and is adapted to communicate a voltage to the watthour meter.

The watthour meter testing device further including an optical pickup and a measurement device. The measurement device is in communication with and adapted to determine the current and voltage communicated to the watthour meter. The optical pickup is in communication with the measurement device and is adapted to detect a consumption indicator on the watthour meter. The optical pickup includes a transmitter positioned to transmit a light signal to the watthour meter and a receiver positioned to detect light adjacent the watthour meter.

The watthour meter testing device also includes a switch in communication with the transmitter and the receiver. The switch has a first position to activate the transmitter to transmit the light signal to the consumption indicator of the watthour meter and activate the receiver to detect the light signal reflected from the consumption indicator of electromechanical watthour meters. The switch further having a second position to activate the receiver to detect a consumption signal from the consumption indicator of electronic watthour meters.

In one embodiment, the watthour meter test device of also includes a current communication line connected at a first end to the current generator and at a second end to the socket. The watthour meter testing device also includes a voltage communication line connected at a first end to the voltage generator and at a second end to the socket. The measuring device further communicates with the current communication line and the voltage communication line.

The optical pickup may further include a housing connected to the housing of the watthour meter test device, the housing of the optical pickup having an outer surface defining an inner retaining space. As such, at least a portion of the transmitter and at least a portion of the receiver are disposed within the inner retaining space of the housing of the optical pickup. The housing of the optical pickup also includes a first end provided with a lens to concentrate the light signal generatable by the transmitter to the consumption indicator of the watthour meter and to concentrate the light adjacent the watthour meter onto the receiver.

In one aspect of the present invention the watthour meter testing device may be provided with a phantom load communicated to the watthour meter instead of current and voltage generators in communication with the socket and connectable watthour meter. The watthour meter testing device provided with a measurement device in communication with and adapted to determine the load communicated to the watthour meter.

In yet another aspect, the present invention provides an optical pickup device for detecting a consumption indicator on a watthour meter. The optical pickup includes a light source, a modulator and a light detector. The light source is adapted to generate a light signal and the modulator operably coupled to the light source such that the light source produces the light signal having a frequency.

The light detector is disposed so as to receive a consumption light from the consumption indicator on the watthour meter. The light detector is operative to generate a consumption signal indicative of receiving the consumption light from consumption indicator. The optical pickup further includes an ambient light filter, an amplifier and an indicator.

The ambient light filter is operably coupled to the light detector. The ambient light filter is adapted to eliminate an ambient light portion of the consumption signal generated by the light detector. The amplifier is adapted to receive the consumption signal from the ambient light filter. The amplifier adapted to amplify the consumption signal having the light portion eliminated by the ambient light filter. The indicator operably coupled to receive the amplified consumption signal and generate an indication relative to the electrical consumption measured by the watthour meter.

In one embodiment, the optical pickup may further include a transmission line and a reception line. The transmission line has a first end and a second end. The first end of the transmission line is disposed adjacent the light source and adapted to communicate the light signal from the first end to the second end of the transmission line and to the consumption indicator on the watthour meter. The reception line has a first end and a second end. The first end of the reception line is disposed adjacent the consumption indicator on the watthour meter to receive the consumption light and communicate the consumption light to the second end of the reception line disposed adjacent the light detector.

In yet another embodiment, the light detector is further defined as a wide spectrum light detector, while in other embodiments, the light detector is further defined as a wide spectrum light phototransistor. In other embodiments, the optical pickup may also include a modulation detector operably coupled to receive a consumption signal from the ambient light filter. The modulation detector detecting a portion of the consumption signal having the frequency of the light signal generated by the light source and modulated by the modulator. As such, the modulation detector eliminates a portion of the consumption signal other than the portion of the consumption signal having the frequency of the light signal generated by the light source and modulated by the modulator.

In other embodiments, the modulator modulates the light signal in a range of from about 13.5 to 14.0 kHz and wherein the modulation detector detects the portion of the consumption signal modulated in a range of from about 13.5 to 14.0 kHz.

In another aspect, the present invention provides a method of detecting a consumption indicator on electromechanical and electronic watthour meters. The method includes providing an optical pickup having a switch provided with a first position and a second position. The method provides for switching to the second position of the switch to detect the consumption indicator on electronic meters and detecting a consumption light adjacent the consumption indicator of the watthour meter.

The method includes generating a consumption signal relative to the consumption light, the consumption signal having an ambient light portion. The method provides for filtering the ambient light portion of the consumption signal and amplifying the consumption signal. The method further includes generating an indication perceivable to a user relative to the electrical consumption measured by the watthour meter.

The method also includes switching to the first position of the switch to detect the consumption indicator on electromechanical meters and generating a light signal having a frequency. The method provides for transmitting the light signal onto the consumption indicator. The method include, in other embodiments, modulating the light signal at a frequency and may include detecting a portion of the consumption signal modulated at the frequency of the light signal. In yet other embodiments, the method includes detecting the modulated portion of the light signal is in response to switching the switch to the first position.

In yet another aspect, the present invention provides a watthour meter testing device for testing electromechanical and electronic watthour meters having a consumption indicator on the watthour meter. The watthour meter testing device includes a measuring device, a switch, a transmitter and a receiver. The measuring device communicates with the power measured by the watthour meter.

The switch is operable to test electromechanical watthour meters in a first position and operable to test electronic watthour meters in a second position. The transmitter communicates with the switch. The transmitter is operative to transmit a light signal to the consumption indicator when the switch is in the first position for testing electromechanical watthour meter. The receiver is operative to detect light adjacent the watthour meter.

The receiver provided with a filter operative to filter ambient light and operative to detect the light signal transmitted from the transmitters reflected from the consumption indicator on the watthour meter when the switch is in a first position. The receiver is further operative to detect a consumption light signal emanating from the electronic watthour meters when the switch is in a second position.

In yet another aspect, the present invention provides an optical pickup for detecting a consumption indicator on electromechanical and electronic watthour meters. The optical pickup includes a switch, a transmitter and a receiver. The switch is operable to test electromechanical watthour meters in a first position and operable to test electronic watthour meters in a second position.

The transmitter is adapted to transmit a light signal to the consumption indicator when the switch is in the first position for testing electromechanical watthour meter. The receiver is adapted to detect light adjacent the watthour meter. The receiver provided with a filter to filter ambient light and to detect the light signal transmitted from the transmitter and reflected from the consumption indicator when the switch is in the first position. The receiver is further operative to detect a consumption light signal emanating from the electronic watthour meters when the switch is in a second position.

In yet another aspect, the present invention provides a watthour meter testing device for testing electromechanical and electronic watthour meters having a consumption indicator on the watthour meter. The watthour meter testing device includes a measuring device, a switch, a transmitter and a receiver. The measuring device communicates with the power measured by the watthour meter. The switch is operable to test electromechanical watthour meters in a first position and operable to test electronic watthour meters in a second position.

The transmitter transmits a light signal to the consumption indicator when the switch is in the first position for testing electromechanical watthour meter. The receiver detects light adjacent the watthour meter. The receiver provided with a filter operative to filter ambient light and operative to detect the light signal transmitted from the transmitter reflected from the consumption indicator on the watthour meter when the switch is in a first position and further operative to detect a consumption light signal emanating from the electronic watthour meters when the switch is in a second position.

In yet another aspect, the present invention provides an optical pickup for detecting a consumption indicator on electromechanical and electronic watthour meters. The optical pickup includes a switch operable to test electromechanical watthour meters in a first position and operable to test electronic watthour meters in a second position. The optical pickup further includes a means for transmitting a light signal to the consumption indicator when the switch is in the first position for testing electromechanical watthour meter.

The optical pickup also includes a means for detecting light adjacent the watthour meter, the detector means provided with a means for filtering ambient light and to detect the light signal transmitted from the transmitter and reflected from the consumption indicator when the switch is in the first position and further to detect a consumption light signal emanating from the electronic watthour meters when the switch is in a second position. In one aspect, the optical pickup includes a housing connected to the housing of the watthour meter test device, the housing of the optical pickup having an outer surface defining an inner retaining space.

In yet another embodiment, the transmitter and receiver are disposed substantially within the inner retaining space of the housing of the optical pickup. The housing of the optical pickup includes a first end provided with a lens to focus the light signal generatable by the transmitter to the consumption indicator of the watthour meter and further to focus the light adjacent the watthour meter to the receiver. In one aspect, the transmitter is provided with a light emitting diode for transmitting the light signal, while in other embodiments the transmitter is provided with a laser diode. The transmitter may include a fiber optic line and a collimated lens, such that the collimated lens collimates the light emitted from the light emitting diode onto the fiber optic lens.

In other aspects, the transmitter means includes a means for generating a modulated light signal at a specific frequency and the receiver means includes a means for detecting the light signal modulated at the frequency of the light signal transmitted by the transmitter means.

In yet other embodiments, the demodulation detector is active in a switch first position and wherein the modulation detector is inactive in a switch second position.

One advantage of the present invention is that the switch is provided for switching the watthour meter testing device for testing electromechanical and electronic watthour meters. The switch provides the ability for one device to test a wide-range of watthour meters.

Another advantage of one embodiment of the present invention is that when detecting light emitting from electronic watthour meters the ambient light is filtered to increase accuracy and provide maximum detection. When detecting electromechanical watthour meters, the transmitted light may be modulated at a specific frequency. The receiver may be provided with a modulation detector to detect the light transmitted within the specific frequency range.

By transmitting and detecting light at a specific frequency, detecting black marks and other indicia on electromechanical meters may be accomplished with greater accuracy and efficiency.

Another embodiment of the present invention advantageously provides an optical pickup having a wide spectrum light detector for detecting light with a wide range of spectrums. This is advantageous for detecting, among others, the wide color range of lights emitted from electronic meters.

In one aspect, the optical pickup may be provided coupled to an arm having a first portion pivotally coupled to a second portion. In this aspect, the arm may be magnetically or otherwise positionable adjacent the watthour meter to be tested. In this aspect, the optical pickup may be provided with a communication line coupleable to a processing component or other device communicating with a socket wherein a watthour meter is to be tested. Thus, the optical pickup of the present invention may be advantageously utilized by testing devices provided with unitary or modular sockets and the optical pickup may be temporarily coupled to such device for these purposes.

Other objects, features, and advantages of the present invention will be apparent to those skilled in the art from the following detailed description when read in conjunction with the accompanying drawings and appended claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

It should be understood at the outset that although an exemplary implementation of the present invention is illustrated below, the present invention may be implemented using any number of techniques, whether currently known or in existence. The present invention should in no way be limited to the exemplary implementations, drawings, and techniques illustrated below, including the exemplary design and implementation illustrated and described herein.

Figure 1:
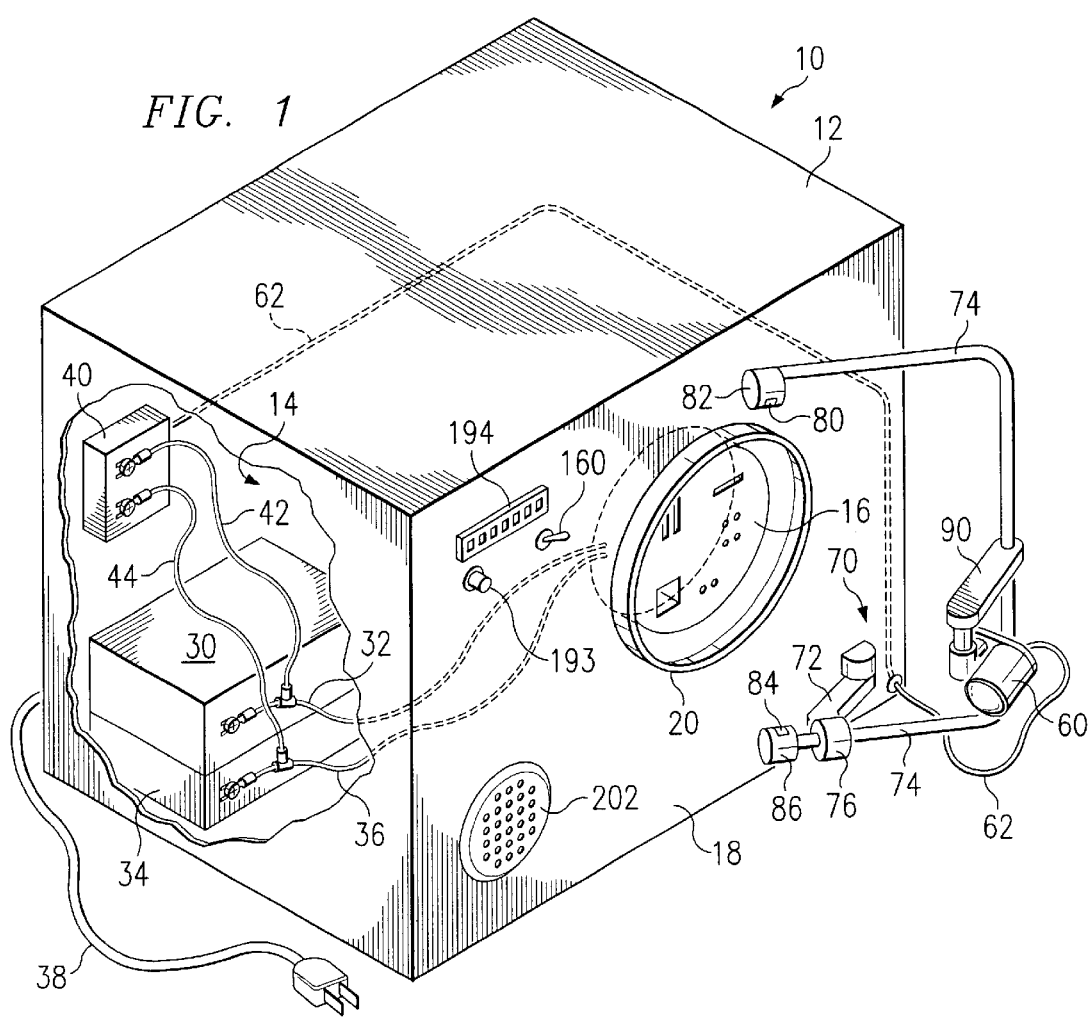
FIG. 1 is a perspective view of one aspect of a watthour meter and optical pickup testing device of the present invention.

FIG. 1 is a perspective view of a watthour meter testing device 10 constructed in accordance with one embodiment of the present invention. The watthour meter testing device 10 is readily adapted for testing both electromechanical and electronic watthour meters. The watthour meter testing device 10 is provided with a housing 12 which may be constructed from a variety of materials such as aluminum, sheet metal, steel, or other substantially rigid materials such as, but not limited to, polymeric materials.

An inner area 14 is enclosed by the housing 12 and provided as a supporting structure for various components of the watthour meter testing device 10. Although the housing 12 is shown as being substantially box or cube-like in configuration wherein the housing 12 is constructed of a plurality of substantially flat surfaces connected together, the housing 12 may be constructed in a variety of configurations such that the watthour meter testing device 10 is still adapted for the purposes of the present invention.

A socket 16 is provided on a first side 18 of the housing 12. The socket 16 is provided with a collar 20 for securing a watthour meter (shown and discussed in greater detail with reference to FIGS. 4 and 5). It will be appreciated that in connection with providing electrical service, electric utilities frequently are required to test watthour meters. Also, manufacturers of watthour meters test the meters to ensure that they accurately measure electrical consumption. Thus, the watthour meter testing device 10 of the present invention may be utilized for any purposes for which watthour meters may be tested to verify the accuracy of the watthour meters.

While the watthour meter testing device 10 of the present invention may be shown and discussed in one embodiment as testing watthour meters suited for a particular application, such as for two or three-phase environments, the watthour meter testing device 10 of the present invention is well suited for testing watthour meters for both two and three-phase systems.

The socket 16 of the watthour meter testing device 10 is readily adapted to receive the watthour meter for secure attachment to the watthour meter testing device 10. However, it will be appreciated that in other embodiments, the watthour meter testing device 10 may be employed to test watthour meters in an installed condition on residential or commercial structures. In these embodiments, the watthour meter testing device 10 may or may not be provided with the socket 16 and collar 20 for receiving the watthour meter.

In yet other embodiments, the watthour meter may be connected to an independent, free-standing, or other device for testing purposes such that the watthour meter is not directly connected to the watthour meter testing device 10 such as by the socket 16 and collar 20. Nevertheless, in these embodiments the watthour meter testing device 10 of the present invention is provided with connectors (not shown) which may be connected to the power supply to which the watthour meter is measuring and the watthour meter testing device 10 may be appropriately positioned for testing under these circumstances. Further, the watthour meter testing device 10 may be provided for portable or field testing with a portable or other power supply readily adapted for testing the accuracy of electromechanical and electronic watthour meters.

The watthour meter testing device 10 further includes a current generator 30 in communication with the socket 16 via a communication line 32. A voltage generator 34 is also provided for communicating a voltage to the socket 16 via a communication line 36. While the current generator 30 and voltage generator 34 are shown disposed within the inner area 14 of the housing 12, it will be appreciated that the current and voltage generators 30 and 34 may be positioned in a number of convenient locations well suited for these purposes.

The watthour meter testing device 10 is provided in this embodiment, with a communication line 38 adapted to power the present invention, such as by plugging connection to a standard power outlet. As previously mentioned, other sources of power may be utilized.

The watthour meter testing device 10 further includes a measurement device 40 disposed within the inner area 14 of the housing 12. The measurement device 40 is provided with a first communication line 42 connected to the communication line 32 of the current generator and adapted to determine the current communicated to the socket 16. The measurement device 40 is further provided with a second communication line 44 connected to the communication line 36 of the voltage generator 34 and adapted to determine the voltage communicated to the socket 16.

Figure 2:
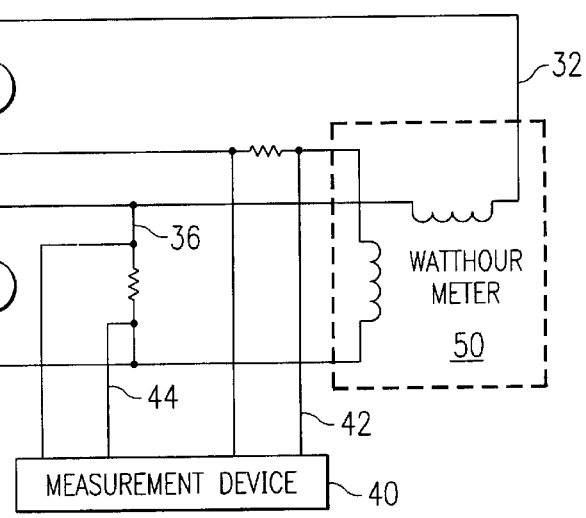
FIG. 2 is a schematic illustrating a current generator and a voltage generator connected to a watthour meter according to one aspect of the watthour meter testing device of the present invention.

Referring also to FIG. 2, one aspect of the current and voltage generators 30 and 34 are shown applying a current and a voltage to a watthour meter 50. It can be seen that the measurement device 40 connected to the current generator 30 and voltage generator 34. This provides the ability to accurately measure the amount of current and voltage applied to the watthour meter 50. In this manner, the measurement device 40 is well situated to determine the amount of power received by the watthour meter 50 and, thus, determine whether the watthour meter is accurately measuring electrical consumption. It will be appreciated that while the current generator 30 and voltage generator 34 are utilized in one embodiment as an accurate method of providing power to the watthour meter 50, in other embodiments, a load may be provided to the watthour meter such that the measurement device 40 samples the load prior to delivery to the watthour meter 50. As such, the measurement device 40 is similarly adapted to determine the amount of load received by the watthour meter 50, and thus determine whether the watthour meter 50 is accurately measuring the load for testing purposes.

Referring again to FIG. 1, an optical pickup 60 is adapted to detect a consumption indicator (shown in greater detail with reference to FIGS. 4 and 5) on watthour meter 50. The optical pickup 60, in one embodiment, communicates with the measurement device 40 via a communication line 62. The optical pickup 60 connected to a positioning assembly 70 for positioning the optical pickup 60 at a proper point adjacent the watthour meter 50.

The positioning assembly 70 may be connected to the first side 18 of the housing 12 in a variety of manners such as, for example, by screwing, bolting, welding, bonding, or other means, or may be constructed as a substantially unitary piece as a portion of the first side 18 of the housing 12. The positioning assembly 70 is shown as having a swivel arm 72 which may swing about the first side 18 of the housing 12.

A U-shaped member 74 is connected to the swivel arm 72 at a first end 76 of the swivel arm 72. In one embodiment, the watthour meter testing device 10 may be provided with a C-sensor for detecting, as previously discussed, discs provided on electromechanical watthour meters having an opening extending through the disc indicative of a given watthour consumption measurement. As such, the C-sensor may be provided with a transmitter 80 provided on a first end 82 of the U-shaped member 74. A receiver 84 is disposed on a second end 86 of the U-shaped member 74. In this manner, the C-sensor is adapted to transmit a light signal from the transmitter 80 such that the light signal is received by the receiver 84 for detecting openings in or holes extending through discs in electromechanical watthour meters.

The optical pickup 60 may be disposed, in one embodiment, on an arm 90 extending from the U-shaped member 74. It is readily apparent that the positioning assembly 70 having the swivel arm 72 extended therefrom and rotatable thereabout the first side 18 of the housing 12, as well as the U-shaped member 74 connected to the first end 76 of the swivel arm 72 provides for maximum extension and positioning of the optical pickup 60 about the watthour meter when the watthour meter is connected to the socket 16.

Furthermore, the arm 90 may be connected to the U-shaped member 74 in a tensioning manner such as by a screw or other tension coupling such that the arm 90 and the optical pickup 60 connected thereto may be positioned at various points along the U-shaped member 74 so that the optical pickup 60 may be positioned in a substantially horizontal or vertical manner.

Figure 3:
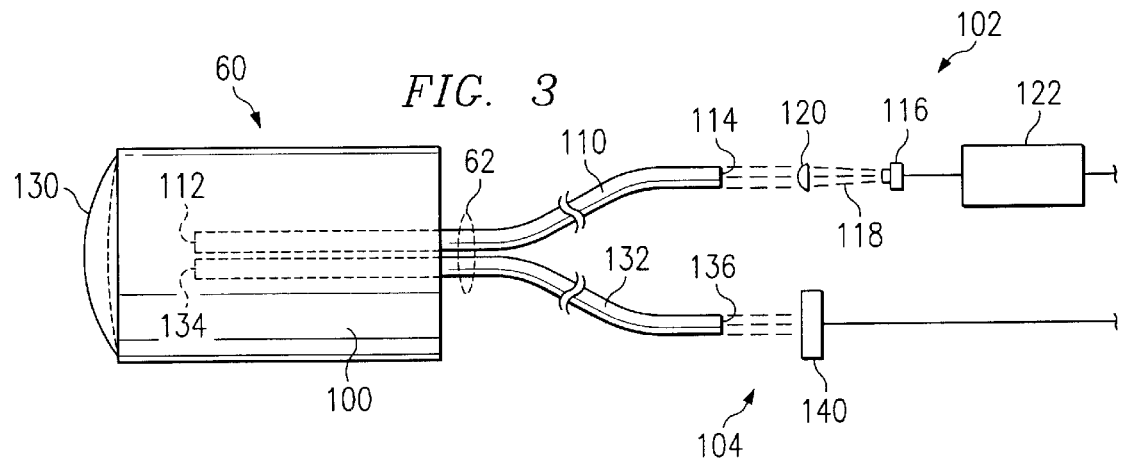
FIG. 3 is a side view of the optical pickup according to one aspect of the present invention.

Referring also to FIG. 3, one embodiment of the optical pickup 60 is shown having a housing 100 that is a substantially cylindrical. The optical pickup 60 includes a transmitter 102 and a receiver 104. The transmitter 102 may include a fiber optic line 110 having a first end 112 and a second end 114. In one embodiment, the transmitter 102 includes a light source 116 adapted to generate a light signal 118. The light source 116 may be a light emitting diode (LED) or laser diode adapted to generate the light signal 118 having a variety of characteristics.

In certain applications, it may be advantageous to use a light emitting diode for cost purposes while for purposes of increased quality and accuracy of the light signal 118, it may be advantageous to employ a laser diode. In other embodiments, the light source 116 is an LED light. A collimated lens 120 may be disposed between the light source 116 and the second end 114 of the fiber optic line 110 so as to concentrate the light signal 118 emitting from the light source 116 onto the fiber optic line 110.

In one embodiment, the transmitter 102 may include a modulator 122 adapted to receive an input signal from, for example, a power source and modulate the frequency of the signal such that the light source 116 generates the light signal 118 having certain frequency characteristics. The frequency characteristics of the light signal 118 will be discussed in greater detail hereinafter with reference to FIG. 6.

In this construction, the light source 116 generates a light signal 118 received by the fiber optic line 110 which is communicated to the first end 112 of the fiber optic line 110. However, in other embodiments, the collimated lens 120 and the light source 116 may be disposed within the housing 100 of the optical pickup 60 and the fiber optic line 110 may be omitted from construction. In either event, it is advantageous to provide a lens 130 to focus or concentrate the light signal 118 exiting the first end 112 of the fiber optic line 110 onto the watthour meter for detection purposes. The lens 130 so disposed provides an intensified light signal 118 which, in testing electromechanical watthour meters, may be reflected from the watthour meter for detection purposes.

The receiver 104 includes a fiber optic line 132 having a first end 134 and a second end 136. Another advantage of the lens 130 is that it has the effect of concentrating the reflected light signal from the watthour meter, as well as light emitting from the watthour meter in the case of electronic meters onto the first end 134 of the fiber optic line 132 of the receiver 104. In this manner, the reflected light signal is transmitted via the fiber optic line 132 to the second end 136 thereof and onto a light detector 140 of the receiver.

The light detector 140 may be a phototransistor or other devices sensitive to light and adapted to generate a signal indicative of receiving light having various characteristics. In one embodiment, a phototransistor or photodiode maybe utilized for these purposes. A phototransistor may be provided with the capability to detect a wide spectrum of light having various color and intensity characteristics.

This is advantageous since electronic meters are manufactured under various standards, as previously discussed, such that the consumption indicators may emit light having a broad range of colors and intensities. Furthermore, an accurate wide spectrum light detector 140 is advantageous for detecting the reflected light returning from the watthour meter after having been transmitted by the transmitter 102. In the embodiment shown, the communication line 62 of the optical pickup 60 may comprise the fiber optic lines 110 and 132 of the transmitter 102 and receiver 104, respectively. In this embodiment, the communication line 62 communicates the light signals carried thereon to the measurement device 40 wherein the transmitter 102 components, such as the light source 116, are contained along with the receiver 104 components, such as the light detector 140. In other embodiments, the transmitter 102 and receiver 104 components may be independently retained within the inner area 14 of the housing 12.

Figure 4:
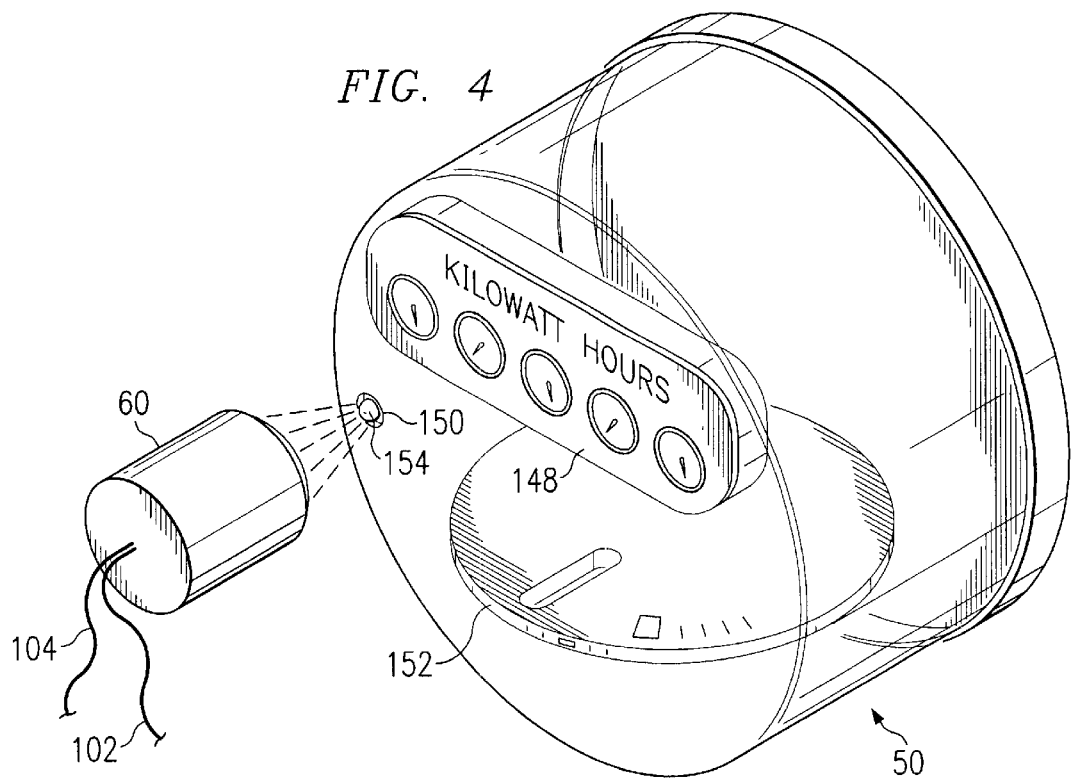
FIG. 4 is a perspective view of a watthour meter with electromechanical and electronic consumption indicators with the optical pickup of the present invention shown receiving a consumption indicator signal from the electronic watthour meter.

FIG. 4 illustrates the watthour meter 50 typical of watthour meters used in commercial and residential environments for measuring electrical consumption. For illustrative purposes, the watthour meter 50 illustrated in FIG. 4 is shown having electromechanical as well as electronic features. In either instance, the watthour meter 50 is provided with a display 148 which may include a plurality of dials in the case of electromechanical watthour meters or may be an electronic display, such as an LED display, to register the total consumption of kilowatt hours to date.

The watthour meter 50 further includes a consumption indicator 150 which in electromechanical watthour meters may be a disc 152 that is substantially circular and rotates within the watthour meter 50 as previously discussed. The disc 152 rotates mechanically in proportion to the electrical consumption measured by the watthour meter 50. A complete revolution of the disc 152 is relative to a specific electrical consumption registered by the watthour mater 50.

The consumption indicator 150 of electronic watthour meters are generally an indicator light 154 in lieu of the disc 152. The indicator light 154 of electronic meters typically flashes in proportion to the electrical consumption measured by the watthour meter, generally two flashes is equivalent to one turn on the disc 152. Thus, the time interval between the flash of light by the indicator light 154 is relative to the kilowatt hours measured by the watthour meter 50.

It will be appreciated that watthour meters, such as the watthour meter 50, are generally only provided with either the disc 152 as in the case of electromechanical watthour meters or the indicator light 154 as in the case of electronic watthour meters. The disc 152 and indicator light 154 have been shown on the watthour meter 50 of FIG. 4 for demonstrative purposes only as these features are ordinarily not coexistent.

When the watthour meter testing device 10 is utilized for testing of electronic watthour meters, the optical pickup 60 may be positioned in front of the watthour meter 50 such that the optical pickup 60 is substantially adjacent the indicator light 154 substantially as shown in FIG. 4. In this manner, the consumption signal, such as the light periodically emitting from the light indicator 154, is shown onto the lens 130 of the optical pickup 60. The lens 130 has the effect of focusing the consumption signal emanating from the indicator light 154 onto the receiver 104 of the optical pickup 60. Referring also to FIG. 3, the light is received by the first end 134 of the fiber optic line 132 of the receiver 104 and communicated to the second end 136 thereof and onto the light detector 140 of the receiver 104.

One advantage of the watthour meter testing device 10 of the present invention is that it is provided with a switch 160 (see FIG. 1) which maybe disposed on the first side 18 of the housing 12 and is in communication with the optical pickup 60. When testing electronic watthour meters, the switch 160 may be placed in a second position 190 to activate the receiver 104 to detect the consumption signal, such as the light emitting from the consumption indicator 150, which in the case of electronic meters is the indicator light 154.

It will be appreciated that electronic watthour meters emit light to indicate electric consumption and, thus, the transmitter 102 of the optical pickup 60 is unnecessary in these applications. The switch 160 is electrically connected to the optical pickup 60 and may be advantageously caused to disconnect the transmitter 102 from operation for these purposes.

Since electronic meters generate their own light, it may be advantageous to disconnect the transmitter 102 so as to minimize the amount of unnecessary light received by the receiver 104 for purposes of accurately detecting the light emitting from the indicator light 154 on electronic watthour meters. However, in other embodiments the transmitter 102 may be allowed to continue to transmit with the effect of the switch 160 being to cause the receiver 104 to ignore the light transmitted by the transmitter 102 while continuing to detect the light emitting from the indicator light 154 of the electronic watthour meter.

For measuring electromechanical watthour meters, the switch 160 of the watthour meter testing device 10 is placed in a first position 188 to activate the transmitter 102 to transmit the light signal 118 to the consumption indicator 150, in the case of electromechanical watthour meters this is the disc 152, and activate the receiver 104 to detect the light signal reflected from the consumption indicator 150.

As previously discussed, the disc 152 may be provided with indicia, such as a black mark 164 provided on the outer peripheral edge 166 or an upper surface 168 of the disc 152. It will be appreciated that the indicia 164 may be disposed at a number of locations about the disc 152 such as a lower surface (not shown) or other locations on the disc 152 and may be detected by the optical pickup 60 nevertheless. However, typically the disc 162 includes indicia 164 about the upper surface 168 or about the outer peripheral edge 166 of the disc 152.

Figure 5:
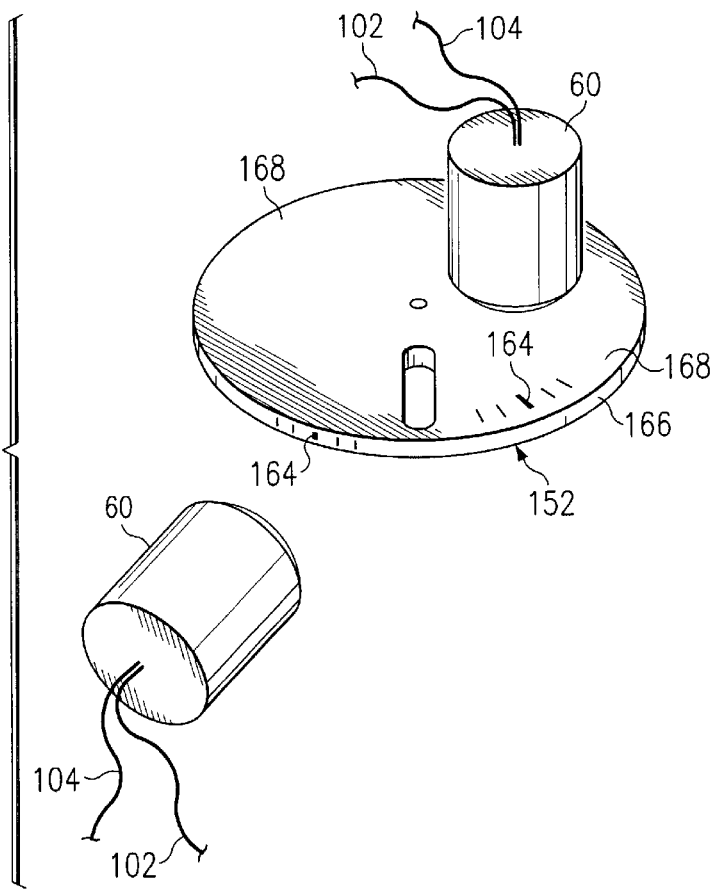
FIG. 5 is a perspective view of a disc of the electromechanical watthour meter shown with the optical pickup of the present invention disposed for detecting consumption measurement.

Utilizing the positioning assembly 70 (see FIG. 1), the optical pickup 60 may be positioned substantially adjacent the outer peripheral edge 166 of the disc 152 or above the disc 152 so as to detect indicia 164 on the upper surface 168, substantially as shown in FIG. 5. In this manner, the transmitter 102 transmits the light signal 118 generated by the light source 116, which may or may not be modulated by the modulator 122. By so positioning the optical pickup 60, the light signal 118 is directed onto the upper surface 168 or outer peripheral edge 166 and is reflected back toward the optical pickup 60.

In a reflective mode, the light signal 118 returned will have a stronger light characteristic when it is not reflected from the indicia 164, such as the black mark. However, it should be appreciated that discs 152 commonly have more than one black mark and in this instance it is difficult, as previously discussed, to discern between smaller black marks used for reference or other purposes and the significant black mark, which is typically larger. In any event, the receiver 104 must necessarily be able to discern from the returned or reflected light signal 118 the differences between the surface of the disc 152, smaller, insignificant black marks, and the significant black mark utilized for measuring electrical consumption by the watthour meter 50.

Figure 6:
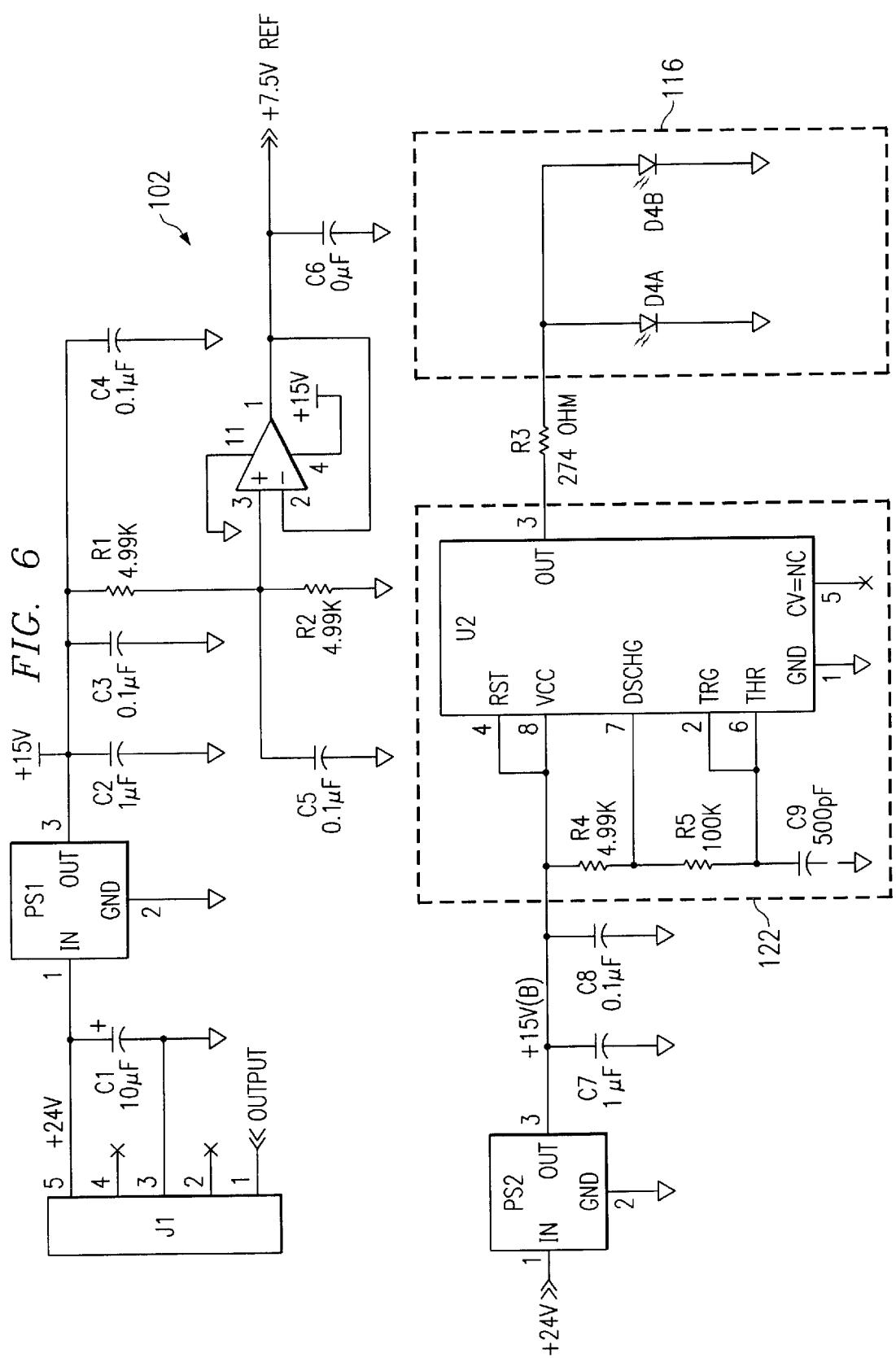
FIG. 6 is a schematic of a transmitter of the optical pickup according to one aspect of the present invention.

FIG. 6 illustrates a schematic of one embodiment of the transmitter 102 of the optical pickup 60. As previously discussed, the transmitter 102 generally includes the modulator 122 and the light source 116. As shown in FIG. 6, the light source 116 may be a light emitting diode (LED) and various models of LEDs may be provided and utilized under different circumstances.

The modulator 122 is operably connected to the light source 116 and a power supply (not shown) and, in one embodiment, modulates the signal at 13.5 kHz. The transmitter 102 may be provided such that the modulator 122 modulates the signal received by the light source 116, and the resulting light signal 118 emitted therefrom, at any number of frequencies or frequency ranges to accomplish a light signal 118 modulated at a frequency so as to be detectable by the receiver 104 for detection purposes. However, a frequency range of 13.5–14 kHz may be advantageous according to one aspect of the present invention.

While the schematic of the transmitter 102 shown in FIG. 6 provides one example of the construction of the transmitter 102, it should be appreciated that the transmitter 102 may be constructed in a number of different and various ways and that the schematic illustrated in FIG. 6 is only one of the ways in which the transmitter 102 of the present invention may be constructed. For example, the schematic illustrated in FIG. 6 provides for detecting various power supply situations, accommodating only one power supply, and detecting and splitting the power into the desired range, such as 7.5 volts output. The schematic, as shown in FIG. 6, of the transmitter 102 illustrates a plurality of components configured and arranged in a particular order for constructing the transmitter 102 in accordance with one embodiment of the present invention.

This construction, while advantageous in one embodiment, may be altered or modified wherein additional components are included or some components shown may be removed while still providing the transmitter 102 adapted for the purposes described herein and are all within the spirit and scope of the present invention. For purposes of brevity, each component of the schematic of the transmitter 102 will not be detailed since it is well within the ordinary skill in the art to determine how to make and use the transmitter 102 from the schematic illustrated in FIG. 6.

Figure 7:
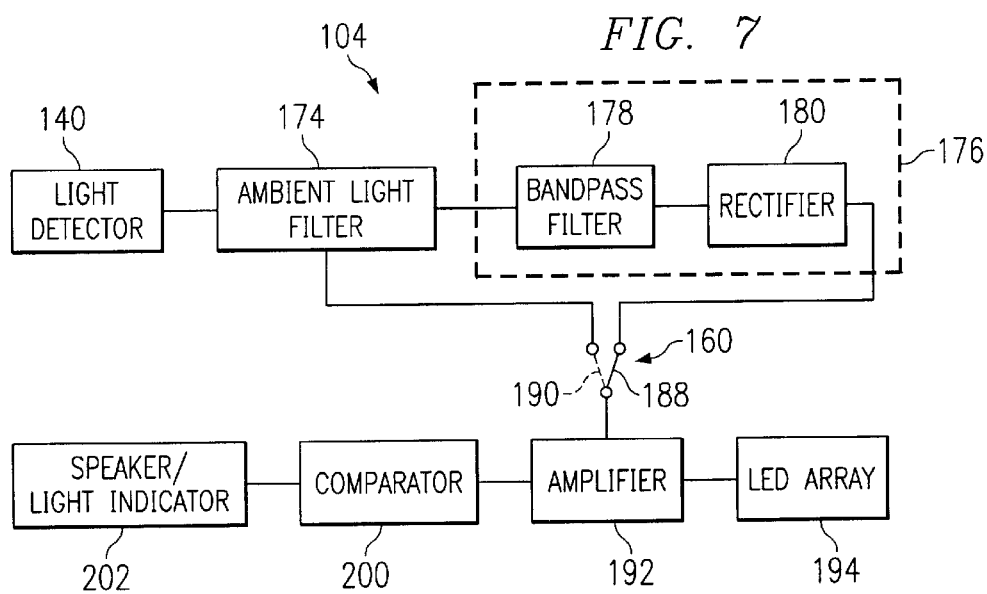
FIG. 7 is a block diagram of a receiver of the optical pickup according to one aspect of the present invention.

FIG. 7 illustrates a block diagram of the receiver 104 of the optical pickup 60 according to one aspect of the present invention. The receiver 104 includes, as previously discussed, the light detector 140 for detecting a wide spectrum of light received through the lens 130 of the optical pickup 60.

Figure 8A:
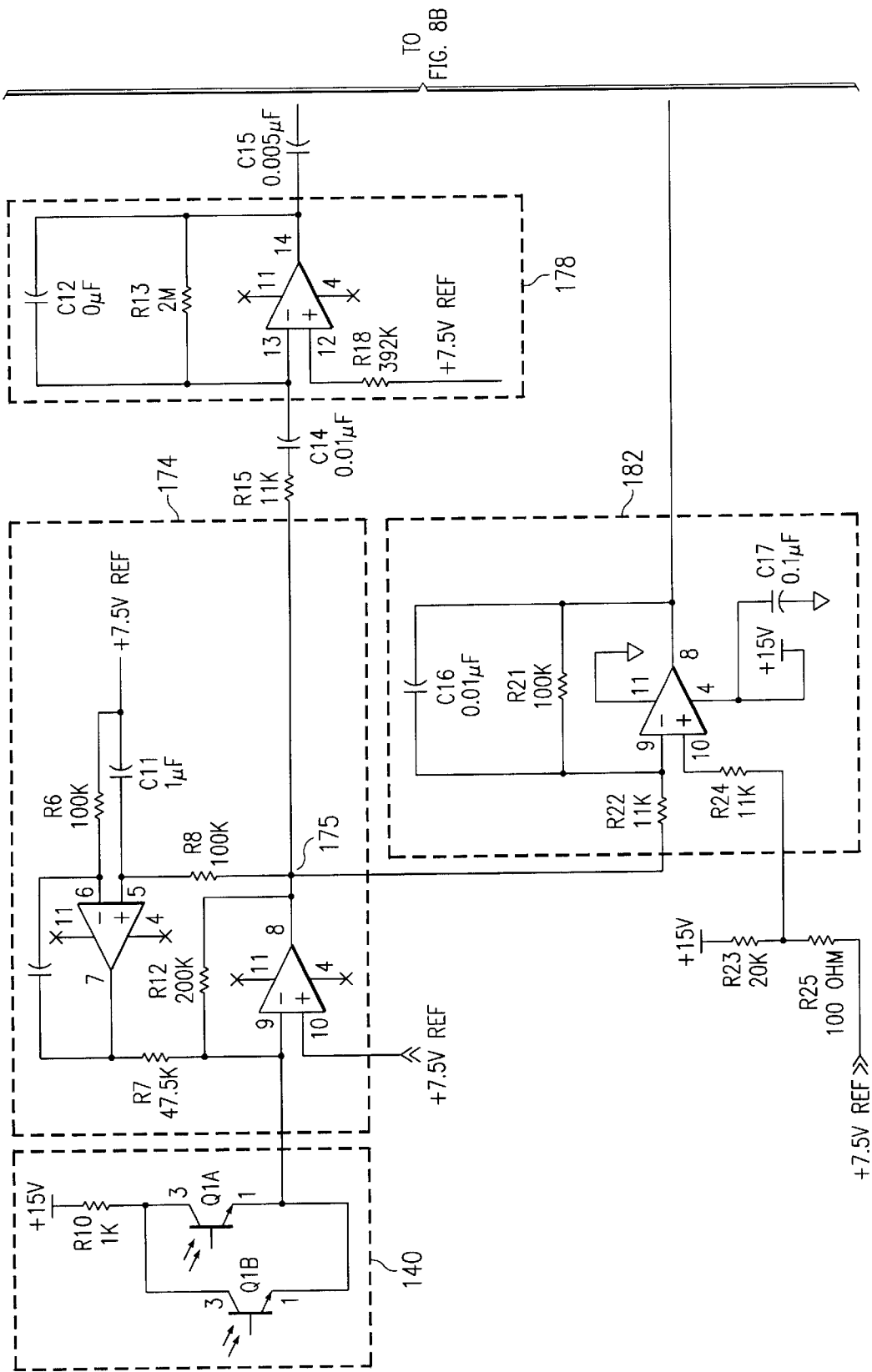
FIG. 8 is a schematic illustrating the receiver shown having a light detector, an ambient light filter and a modulation detector constructed in accordance with one aspect of the present invention.
Figure 8B:
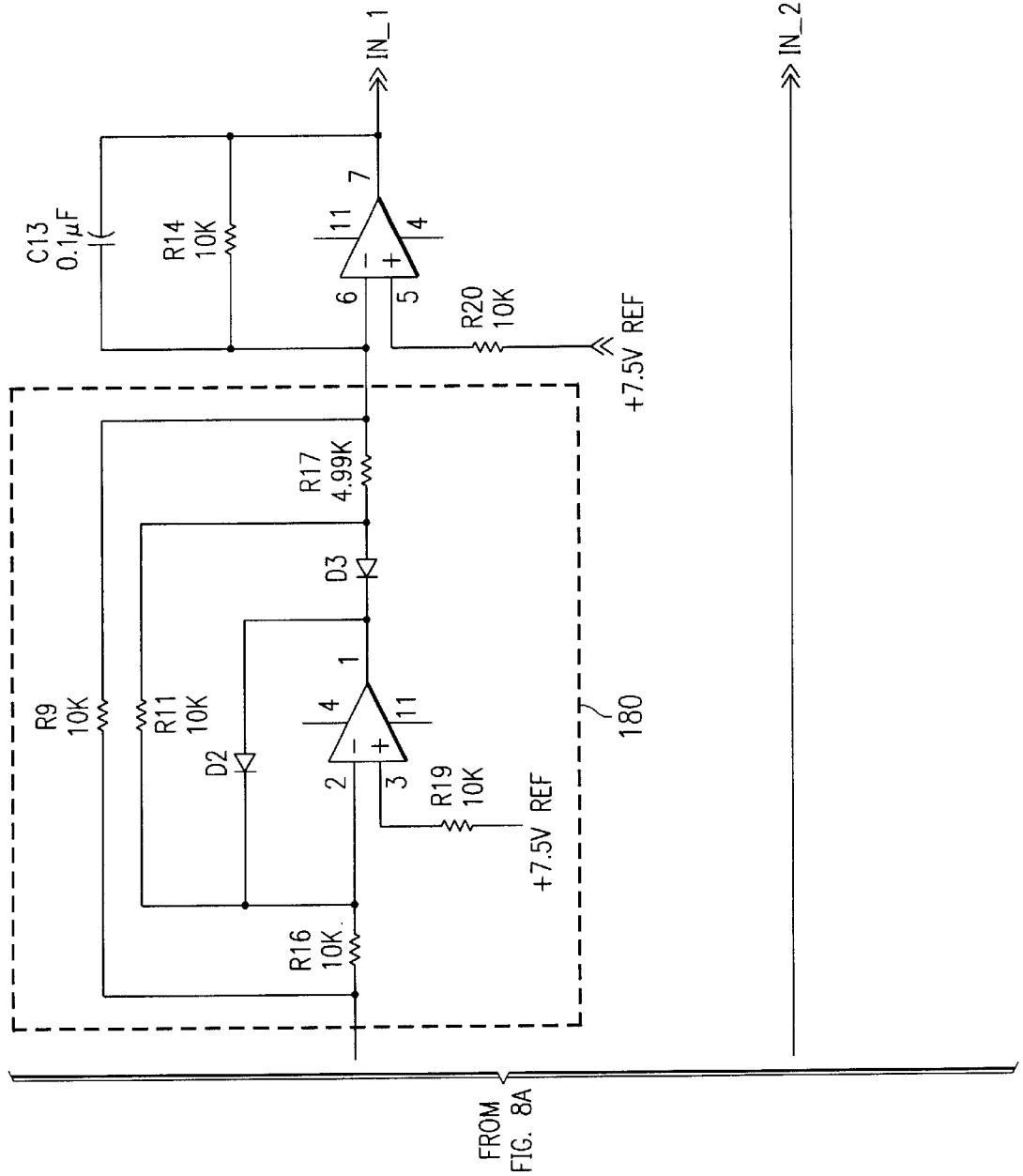

Referring also to FIG. 8, a schematic illustrating the construction of the receiver according to one aspect of the present invention is shown having the light detector 140.

The schematic illustration as shown in FIG. 8 of the light detector 140 is one of numerous configurations and models for the light detector 140. It will be appreciated that the schematic illustration of the light detector 140 and other elements of the receiver 104 are well within those skilled in the art and thus, for purposes of brevity, will not be discussed in detail with respect to each and every individual element. It should further be appreciated that substitution of components and various configurations, connections and organization of the components as well as adding or removing various components to achieve the function and capability as well as the advantages of the present inventions are well within the spirit and scope of the present invention as disclosed and claimed herein.

The light detector 140 is operative to generate a consumption signal indicative of receiving the consumption light, such as the light signal 118 transmitted from the transmitter 102 and reflected from the disc 152 of electromechanical watthour meters or light emitting from the indicator light 154 of electronic watthour meters. The light detector 140 is adapted to detect light having various characteristics, whether generated directly from the indicator light 154 or the reflected light signal 118 transmitted from the transmitter 102.

The light detector 140 is in communication with an ambient light filter 174. The ambient light filter 174 is adapted to eliminate an ambient light portion of the consumption signal generated by the light detector 140. The advantage of the construction of the ambient light filter 174, shown in FIG. 8, is that voltage of the consumption signal is zero at a point 175 when the consumption signal includes only ambient light. As such, the ambient light filter 174 may be utilized for filtering ambient light from the consumption signal for both electromechanical and electrical watthour meter detection applications. This additional advantage will be discussed in greater detail hereinafter with respect to the operation of the switch 160 with reference to FIG. 9.

The receiver 104 may be provided in one embodiment with a modulation detector 176. The modulation detector 176 is adapted to detect a portion of the consumption signal generated by the light detector 140 and filtered by the ambient light filter 174 and having the frequency of the light signal 118 generated by the light source 116 of the transmitter 102.

In this manner, the modulation detector 176 is capable of discerning the light signal 118 transmitted by the transmitter 102 from other light sources, such as ambient or other light which might otherwise interfere with the accurate detection by the receiver 104. The modulation detector 176 advantageously provides the optical pickup 60 with the capability to distinguish between various light sources. In one embodiment, the modulation detector 176 may include a bandpass filter 178 adapted to filter a portion of the consumption signal out of band, for example, the portion of the consumption signal other than that at the frequency transmitted by the transmitter 102, such as frequencies in the range of 13.5–14 kHz as in the present example. The modulation detector 176 may further include a rectifier 180 adapted to rectify the consumption signal received from the bandpass filter 178.

With reference to FIG. 8, it will be readily appreciated that the ambient light filter 174 and the modulation detector 176 are shown according to one embodiment of the present invention. As previously mentioned, the construction of the receiver 104 may be accomplished in a number of alternative manners which may include substitution or addition of components as well as a different connection or interconnection there between the components and are within the spirit and scope of the present invention which will readily suggest themselves to one of ordinary skill in the art.

The modulation detector 176 after receiving the signal filtered by the ambient light filter 174 has the effect of passing the consumption signal which may be interpreted as having either square or sinusoidal-wave form wherein the portion of the consumption signal with an increased amplitude indicates a strong reflection from the unmarked surface of the disc 152 and wherein the reduced or lowered amplitude portion of the consumption signal is indicative of that reflected from the indicia 164 or black mark on the surface of the disc 152 of electromechanical watthour meters. As previously discuss, the modulation detector 176 may be constructed in numerous ways so as provide a means for obtaining the demodulated consumption signal or otherwise be adapted to determine from the consumption signal the relationship to the indicia 164 provided on the disc 152.

An amplifier 182 may be beneficially utilized as shown in the schematic prior to sampling the signal when detecting light emitting from the light indicator 154 of electronic watthour meters. The amplifier 182 as shown may be provided in a variety of different configurations for these purposes.

Referring again to FIG. 7, the switch 160 is shown in the first position 188 such that the consumption signal is received from the modulation detector 176. The switch 160 in a first position 188 is utilized for testing electromechanical watthour meters wherein the light received by the light detector 140 is the reflection of the light signal 118 transmitted by the transmitter 102 at a specific frequency.

As previously discussed, the transmitter 102 may transmit light at various frequencies. However, the most efficient frequency for obtaining the advantage according to one embodiment of the present invention is 13.5 kHz. As such, the modulation detector 176 is adapted to detect the portion of the consumption signal modulated at 13.5 kHz. This promotes accurate detection of the consumption signal portion relative to that transmitted by the transmitter 102. Although frequencies in the range of 13.5–14 kHz may be advantageous, a number of frequency ranges may also be utilized to modulate and demodulate so long as the transmitter 102 and receiver 104 utilize the same frequency for these purposes. In other embodiments, no frequency modulation is employed by either the receiver 104 or transmitter 102.

The switch 160 may be provided in a second position 190 for detecting light emanating from electronic watthour meters. It will be appreciated that the modulation frequency range is generally unknown on the wide range of light emanating from indicator lights 154 on the electronic watthour meters. For this reason, the receiver 104 may only detect the light utilizing the light detector 140 and filter the light utilizing the ambient light filter 174. Furthermore, since the light is directly received by the receiver 104 and is not a reflected signal as in light reflected from the disc 152 of electromechanical meters, the signal is typically more easily discernable.

This is another advantage of the present invention. By constructing the receiver 104 according to FIG. 8, the modulated signal transmitted by the transmitter 102 is easily detected by the modulation detector 176 when the switch 160 is in the first position 188. However, for receiving light from indicator lights 154 of electronic watthour meters, the modulation detector 176 is omitted when the switch 160 is in the second position 190. This is advantageous since, when the modulation is unknown, as in electronic meters, attempting to detect modulation would be inaccurate and cause detection errors.

In either case, whether measuring electromechanical or electronic watthour meters, the signal is passed from the switch 160 to an amplifier 192. The amplifier 192 is adapted to amplify the signal and may be accomplished and shown in FIG. 9 which illustrates a schematic of one embodiment of the amplifier 192 and switch 160 of the receiver 104. The amplifier 192 communicates the amplified consumption signal to an LED array 194.

The LED array 194 may include more or less than the ten light emitting diodes shown and may be disposed on the first side 18 of the housing 12 to indicate the strength or weakness of the consumption signal received by the receiver 104. In this manner, an operator or user of the watthour meter testing device 10 may be able to visually determine whether the optical pickup 60 is properly positioned so as to optimally detect the consumption indicator 150 on the watthour meter 50. As such, the user may adjust the distance as well as the angle or attitude of the optical pickup 60 to optimize the reception for these purposes. Thus, by providing the LED array 194 disposed so as to be visually perceptible to the user, a more accurate measurement of the watthour meter consumption indicator may be obtained by the watthour meter testing device 10.

In one embodiment, the amplifier 192 may be coupled to a dialed switch 193 adapted to increase or decrease the amplitude magnification applied to the consumption signal by the amplifier 192. The advantage being that the user of the watthour meter testing device 10 may manipulate the dialed switch 193 based upon the strength of the consumption signal as perceived by the user displayed on the LED array 194. In this manner, the user may further optimize detection of the consumption indicator by the optical pickup 60. The dialed switch 193 advantageously provides the user with the ability to eliminate interference, such as noise from smaller, irrelevant, marks on the disc 152.

Figure 9:
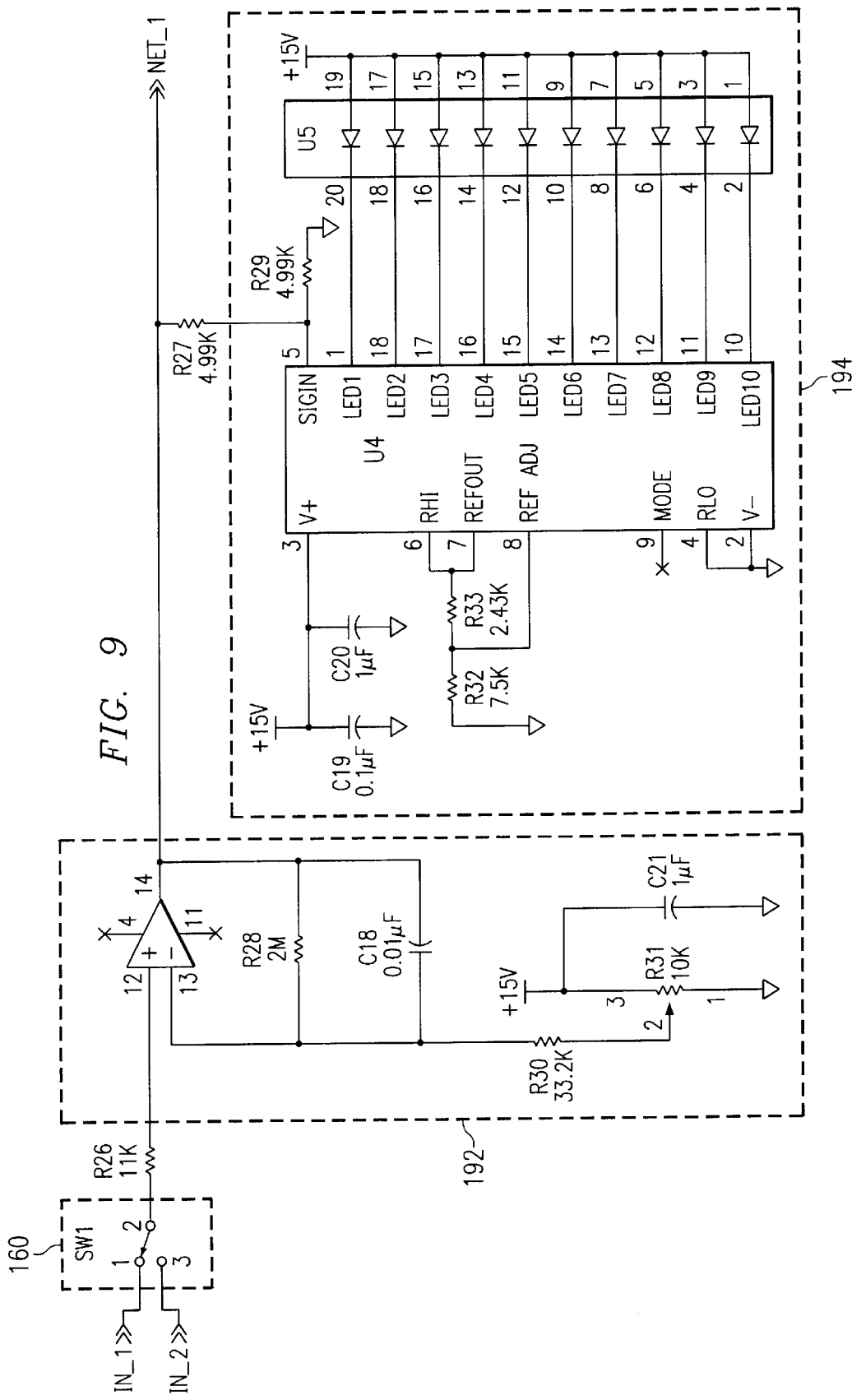
FIG. 9 is a schematic illustrating the receiver shown having a switch, an amplifier and an indicator according to one aspect of the present invention.

With reference to FIG. 9, as previously discussed, the switch 160, the amplifier 192, and the LED array 194 are shown in a manner which will be readily understood by one of ordinary skill in the art and for purposes of brevity will not be discussed in greater detail. However, it should be appreciated that any number of components including those shown as well as additional components not shown may be utilized and configured in a variety of ways to obtain the advantages and features of the present invention and are within the spirit and scope of the invention as disclosed and claimed herein.

Figure 10:
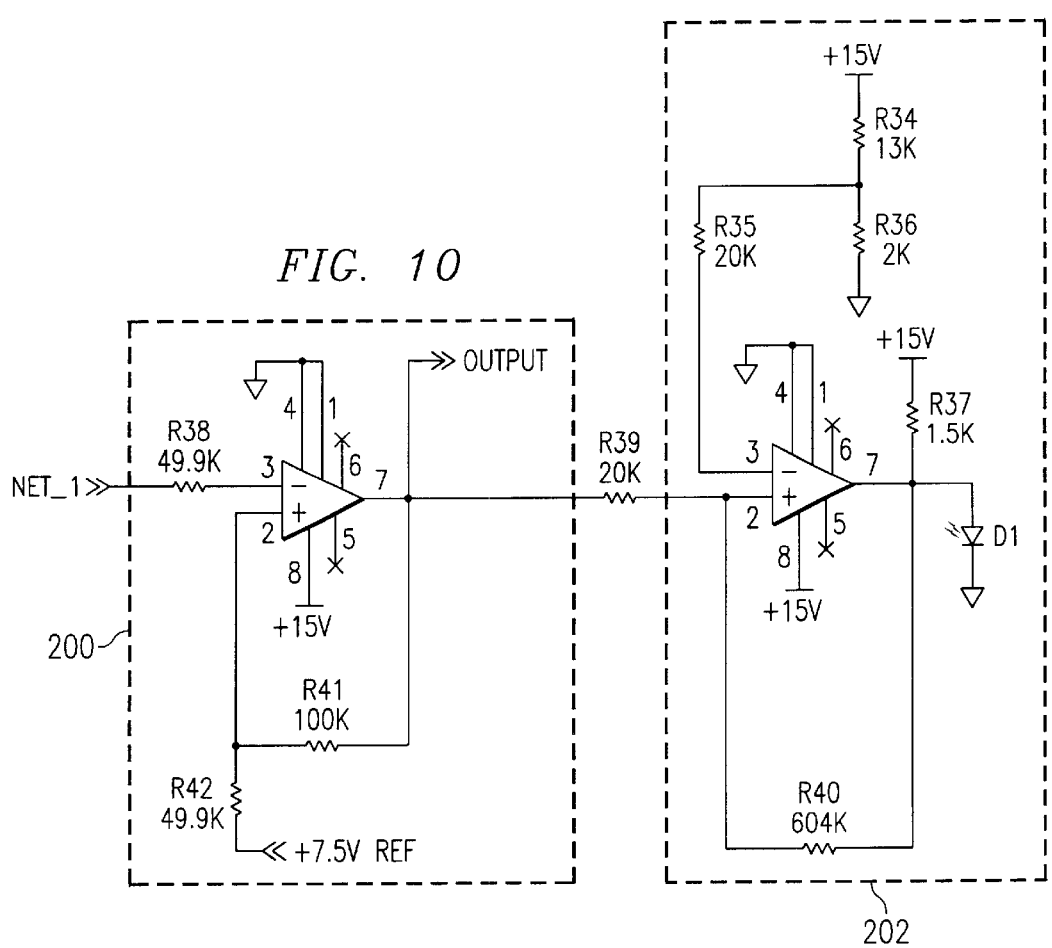
FIG. 10 is a schematic illustrating the receiver shown having a comparator and another indicator according to yet another aspect of the present invention.

The amplifier 192 also communicates with a comparator 200 which is adapted to determine whether or not the consumption signal indicating detection of the measured consumption indicator 150 has been received from the amplifier 192. Referring also to FIG. 10, the comparator 200 may, in one embodiment, communicate with an indicator 202 which may include a visually perceptible indicator light or a speaker, as shown in FIG. 1, on the first side 18 of the housing 12.

The indicator 202 may emit an audible tone perceptible to a user or a single flashing indicator light perceptible to the user of the watthour meter testing device 10 to verify the accuracy of the reception by the receiver 104 of the optical pickup 160. In this manner, the user of the watthour meter testing device 10 can visually determine that the consumption indicator is being detected by the watthour meter testing device 10, such as by visually perceiving on the electronic watthour meter the light signal emanating from the indicator light 154, while at the same time perceiving the tone emanating from the speaker 202.

As previously discussed, the comparator 200 and the indicator 202 are shown constructed according to one embodiment. It will be appreciated that a number of components may be utilized, eliminated, or others added as well as various organization of these components may be utilized to obtain the advantages and achieve the goals of the present invention and remain within the spirit and scope of the present invention as described and disclosed herein.

Once the optical pickup 60 is able to ascertain the electrical consumption measured by the watthour meter, this consumption is compared with the amount of current and voltage communicated to the watthour meter for determining the accuracy of the watthour meter.

Figure 11:
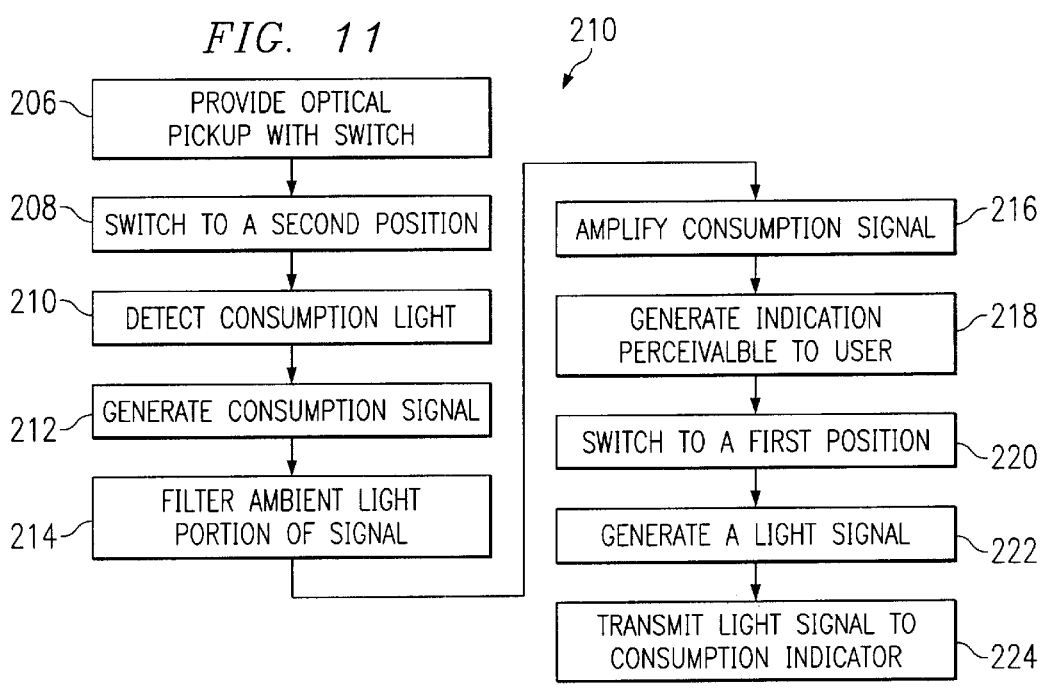
FIG. 11 is flow-chart illustrating a method for detecting a consumption indicator on watthour meters.

FIG. 11 illustrates a flowchart of a method 210 of detecting the consumption indicator 150 on electromechanical and electronic watthour meters 50 according to one aspect of the present invention. At a first block 206, the method includes providing the optical pickup 60 having the switch 160 provided with the first position 188 for testing electromechanical watthour meters and the second position 190 for testing electronic watthour meters. At a block 208, the method provides for switching to the second position 190 to detect the consumption indicator 150 on the electronic meter. At a block 210 the method provides for detecting the consumption light emanating from the indicator light 154 of the electronic watthour meter. As previously discussed, this may include positioning the optical pickup 60 substantially adjacent the indicator light 154 of the watthour meter.

At a block 212, the method further includes generating a consumption signal relative to the consumption light received by the receiver 104. The method further provides for filtering an ambient light portion of the consumption signal at a block 214.

At a block 216, the method includes amplifying the consumption signal. At a block 218, the method includes generating an indication perceivable to a user of the watthour meter testing device 10. The indication perceivable to the user relative to the electrical consumption detected from the consumption indicator 150 of the watthour meter.

The method further provides, at a block 220, for switching to the first position 188 of the switch 160 to detect the consumption indicator 150 on electromechanical meters. As previously discussed, the consumption indicator 150 may be a disc 152 provided on the electromechanical meter.

According to one embodiment of the present invention, the method that provides for, at a block 222, generating the light signal 118 having a specific frequency. In one embodiment, when the switch 160 is placed in the first position 188, the transmitter 102 will activate and thereby transmit the light signal 118, while the switch 160, when provided in a second position 190, may operably disconnect the transmitter 102 from transmitting when detecting and testing electronic watthour meters.

However, in other embodiments, the position of the switch 160, that is whether in the first position 188 or the second position 190, will cause the transmitter 102 to transmit in either event. Thus, the only effect of the position of the switch 160 is the effect on the receiver 104. As such, when the switch 160 is in the first position 188, the receiver 104 will further provide for modulation detection by the modulation detector 176 of the consumption signal having the frequency of the light signal 118 transmitted by the transmitter 102. The method 210 further provides for, at a block 224, transmitting the light signal 118 onto the consumption indicator 150.

Thus, it is apparent that there has been provided, in accordance with the present invention, a watthour meter and optical pickup testing device and method that satisfies one or more of the advantages set forth above. Although the preferred embodiment has been described in detail, it should be understood that various changes, substitutions, and alterations can be made herein without departing from the scope of the present invention, even if all of the advantages identified above are not present. For example, the various embodiments shown in the drawings herein illustrate that the present invention may be implemented and embodied in a variety of different ways that still fall within the scope of the present invention.

Also, the techniques, designs, elements, and methods described and illustrated in the preferred embodiment as discrete or separate may be combined or integrated with other techniques, designs, elements, or methods without departing from the scope of the present invention. Other examples of changes, substitutions, and alterations are readily ascertainable by one skilled in the art and could be made without departing from the spirit and scope of the present invention.

What is claimed is:

1. A watthour meter test device for testing electromechanical and electronic watthour meters comprising;
    a housing having a socket adapted to receive a watthour meter;
    a current generator in communication with the socket to communicate a current to the watthour meter;
    a voltage generator in communication with the socket to communicate a voltage to the watthour meter;
    a measurement device coupled to determine the current and the voltage communicated to the watthour meter;
    an optical pickup positioned to detect a consumption indicator on the watthour meter, the optical pickup comprising:
        a transmitter positioned to transmit a light signal to the watthour meter,
        a receiver positioned to detect light adjacent the watthour meter; and
        a switch coupled to the optical pickup, the switch having a first position to activate the transmitter to transmit the light signal to the consumption indicator of the watthour meter and to activate the receiver to detect the light signal reflected from the consumption indicator of electromechanical watthour meters, the switch further having a second position to activate the receiver to detect a consumption signal from a consumption indicator of electronic watthour meters.

2. The watthour meter test device of claim 1, further comprising:
    a current communication line connected at a first end to the current generator and at a second end to the socket; and
    a voltage communication line connected at a first end to the voltage generator and at a second end to the socket.

3. The watthour meter test device of claim 2, wherein the measuring device is in communication with the current communication line and the voltage communication line.

4. The watthour meter test device of claim 1, wherein the optical pickup includes a housing coupled to the housing of the watthour meter test device, the housing of the optical pickup having an outer surface defining an inner retaining space.

5. The watthour meter test device of claim 4, wherein at least a portion of the transmitter and at least a portion of the receiver are disposed within the inner retaining space of the housing of the optical pickup.

6. The watthour meter test device of claim 4, wherein the housing of the optical pickup includes a first end provided with a lens to focus the light signal generated by the transmitter to the consumption indicator of the watthour meter.

7. The watthour meter test device of claim 4, wherein the housing of the optical pickup includes a first end provided with a lens to focus the light adjacent the watthour meter onto the receiver.

8. The watthour meter test device of claim 1, further provided with a processing component coupled to compare the voltage and current measured by the measurement device with the consumption indicator detected by the optical pickup.

9. A watthour meter test device for testing watthour meters comprising;
- a phantom load in communication with the watthour meter to communicate a load to the watthour meter;
- a measurement device in communication with the phantom load to determine the load communicated to the watthour meter;
- an optical pickup coupled to detect a consumption indicator on the watthour meter, the optical pickup comprising:
  - a transmitter positioned to transmit a light signal to the watthour meter,
  - a receiver positioned to detect light adjacent the watthour meter; and
  - a switch coupled to the optical pickup, the switch having a first position to activate the transmitter to transmit the light signal to the consumption indicator of the watthour meter and to activate the receiver to detect the light signal reflected from the consumption indicator of electromechanical watthour meters, the switch further having a second position to activate the receiver to detect a consumption signal from a consumption indicator of electronic watthour meters.

10. The watthour meter test device of claim 9, further provided with a processing component coupled to compare the voltage and current measured by the measurement device with the consumption indicator detected by the optical pickup.

11. An optical pickup device for detecting a consumption indicator on a watthour meter comprising;
- a light source to generate a light signal;
- a modulator operably coupled to the light source such that the light source produces the light signal having a frequency;
- a light detector positioned to receive a consumption light from the consumption indicator on the watthour meter, the light detector operative to generate a consumption signal indicative of receiving the consumption light from consumption indicator;
- an ambient light filter operably coupled to the light detector, the ambient light filter adapted to eliminate an ambient light portion of the consumption signal generated by the light detector;
- an amplifier to receive the consumption signal from the ambient light filter, the amplifier adapted to amplify the consumption signal having the ambient light portion eliminated by the ambient light filter; and
- an indicator operably coupled to receive the amplified consumption signal and to generate an indication perceivable to a user relative to the electrical consumption measured by the watthour meter.

12. The optical pickup device of claim 11, further comprising:
- a transmission line having a first end and a second end, the first end of the transmission line positioned adjacent the light source to communicate the light signal from the first end to the second end of the transmission line and to the consumption indicator on the watthour meter; and
- a reception line having a first end and a second end, the first end of the reception line positioned adjacent the consumption indicator on the watthour meter to receive the consumption light and communicate the consumption light to the second end of the reception line disposed adjacent the light detector.

13. The optical pickup of claim 11, wherein the light detector is further defined as a wide spectrum light detector.

14. The optical pickup of claim 11, wherein the light detector is further defined as a wide spectrum light photo device.

15. The optical pickup of claim 11, further comprising a modulation detector operably coupled to receive the consumption signal from the ambient light filter, the modulation detector detecting a portion of the consumption signal having the frequency of the light signal generated by the light source and modulated by the modulator.

16. The optical pickup of claim 15, wherein the modulation detector eliminates a portion of the consumption signal other than the portion of the consumption signal having the frequency of the light signal generated by the light source and modulated by the modulator.

17. The optical pickup of claim 12, further comprising:
- a housing retaining a lens for directing the light signal toward the consumption indicator and for directing the ambient light toward light detector; and
- a swivel arm having a first portion pivotally coupled to a second portion, the first portion coupled to the housing and the second portion positioned adjacent a socket for receiving the watthour meter.

18. A method for detecting a consumption indicator on electromechanical and electronic watthour meters comprising;
- providing an optical pickup having a switch provided with a first position and a second position;
- switching to the second position of the switch to detect the consumption indicator on electronic meters;
- detecting a consumption light adjacent the consumption indicator of the watthour meter;
- generating a consumption signal relative to the consumption light, the consumption signal having an ambient light portion;
- filtering the ambient light portion of the consumption signal;
- amplifying the consumption signal;
- generating an indication perceivable to a user relative to the electrical consumption indicated by the consumption indicator and detected by the optical pickup;
- switching to the first position of the switch to detect the consumption indicator on electromechanical meters;
- generating a light signal; and
- transmitting the light signal onto the consumption indicator.

19. The method of claim 18, further including modulating the light signal at a frequency.

20. The method of claim 19, further including detecting a portion of the consumption signal modulated at the frequency of the light signal.

21. The method of claim 20, wherein detecting the modulated portion of the light signal is in response to switching the switch to the first position.

22. An optical pickup for detecting a consumption indicator on a watthour meter comprising;
- a light source to generate a light signal;
- a modulator in communication with the light source such that the light source produces the light signal having a frequency;
- a light detection device positioned to receive light adjacent the watthour meter to generate a consumption signal;

an ambient light filter in communication with the light detection device, the ambient light filter to eliminate an ambient light portion of the consumption signal and generate a filtered signal;

a first portion in communication with the ambient light filter and adapted to modify the filtered signal, the first portion having a modulation detector to detect a portion of the filtered signal having the frequency of the light signal generated by the light source;

a second portion in communication the ambient light filter;

a switch having a first position to communicate with the first portion, the switch having a second position to communicate with the second portion;

an amplifier in communication with the switch, the amplifier to receive the filter signal and generate an amplified signal; and an indicator in communication with the amplifier and adapted to receive the amplified signal and to generate an indication perceptible to an operator of the optical pickup, the amplified signal relative to the electrical consumption indicated by the consumption indicator.

23. The optical pickup of claim 22, wherein the modulation detector includes a bandpass filter in communication with the ambient light filter to receive the filtered signal therefrom and filter a frequency portion of the filtered signal other than the frequency of the light signal generated by the light source.

24. The optical pickup of claim 22, wherein the modulation detector includes a rectifier in communication with the bandpass filter, the rectifier adapted to receive the filtered signal from the bandpass filter and generate the filtered signal having a full wave.

25. The optical pickup of claim 23, wherein the modulation detector includes a rectifier in communication with the bandpass filter, the rectifier to receive the filtered signal from the bandpass filter and generate the filtered signal having a full wave.

26. A watthour meter testing device for testing electromechanical and electronic watthour meters having a consumption indicator on the watthour meter, the watthour meter testing device comprising;

a measuring device in communication with an electrical supply communicated to the watthour meter;

a switch operable to test electromechanical watthour meters in a first position and operable to test electronic watthour meters in a second position;

a transmitter to transmit a light signal to the consumption indicator when the switch is in at least the first position for testing electromechanical watthour meter; and a receiver to detect light adjacent the watthour meter, the receiver provided with a filter operative to filter ambient light and operative to detect the light signal transmitted from the transmitter and reflected from the consumption indicator on the watthour meter when the switch is in the first position and further operative to detect a consumption light signal emanating from the electronic watthour meters when the switch is in the second position.

27. The watthour meter testing device of claim 26, further comprising a housing having a socket to receive the watthour meter.

28. A watthour meter testing device of claim 27, further comprising:

a current generator in communication with the socket to communicate a current to the watthour meter; and a voltage generator in communication with the socket to communicate a voltage to the watthour meter.

29. A watthour meter testing device of claim 27, further comprising a phantom load in communication with the watthour meter.

30. A watthour meter testing device of claim 26, further comprising:

a current generator in communication with the socket and adapted to communicate a current to the watthour meter; and a voltage generator in communication with the socket and adapted to communicate a voltage to the watthour meter.

31. An optical pickup for detecting a consumption indicator on electromechanical and electronic watthour meters, the optical pickup comprising;

a switch operable to test electromechanical watthour meters in a first position and operable to test electronic watthour meters in a second position;

a means for transmitting a light signal to the consumption indicator when the switch is in at least the first position for testing electromechanical watthour meter; and a means for detecting light adjacent the watthour meter, the detector means provided with a means for filtering ambient light to detect the light signal transmitted from the transmitter means and reflected from the consumption indicator when the switch is in the first position, the detecting means further to detect a consumption light signal emanating from the electronic watthour meters when the switch is in the second position.

32. The optical pickup of claim 31, further includes a housing having an outer surface defining an inner retaining space and wherein transmitter means and detecting means are disposed at least partially within the inner retaining space of the housing of the optical pickup.

33. The optical pickup of claim 32, wherein the housing of the optical pickup includes a first end provided with a lens to concentrate the light signal generated by the transmitter means to the consumption indicator of the watthour meter.

34. The optical pickup of claim 32, wherein the housing of the optical pickup includes a first end provided with a lens to concentrate the light adjacent the watthour meter to the detecting means.

35. The optical pickup of claim 32, wherein the transmitter means is further provided with a light emitting portion for transmitting the light signal.

36. The optical pickup of claim 35, wherein the transmitter means is further provided a fiber optic line and a collimated lens, such that the collimated lens collimates the light emitted from the light emitting portion onto the fiber optic line.

37. The optical pickup of claim 31, wherein the transmitter means includes a means for generating a modulated light signal at a specific frequency.

38. The optical pickup of claim 37, wherein the receiver means includes a means for detecting the light signal modulated at the frequency of the light signal transmitted by the transmitter means.

39. The optical pickup of claim 38, wherein the transmitting means is active in the switch first position and wherein the transmitting means is inactive in the switch second position.

* * * * *